United States Patent
Doolittle et al.

(10) Patent No.: US 11,319,644 B2
(45) Date of Patent: *May 3, 2022

(54) SYSTEM AND METHOD FOR INCREASING GROUP III-NITRIDE SEMICONDUCTOR GROWTH RATE AND REDUCING DAMAGING ION FLUX

(71) Applicant: Georgia Tech Research Corporation, Atlanta, GA (US)

(72) Inventors: William Alan Doolittle, Atlanta, GA (US); Evan A. Clinton, Atlanta, GA (US); Chloe A. M. Fabien, Atlanta, GA (US); Brendan Patrick Gunning, Atlanta, GA (US); Joseph J. Merola, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/735,568

(22) Filed: Jan. 6, 2020

(65) Prior Publication Data
US 2020/0141026 A1    May 7, 2020

Related U.S. Application Data

(63) Continuation of application No. 15/738,458, filed as application No. PCT/US2016/037930 on Jun. 16, 2016, now Pat. No. 10,526,723.

(Continued)

(51) Int. Cl.
*C30B 23/02* (2006.01)
*H01L 21/02* (2006.01)
(Continued)

(52) U.S. Cl.
CPC ........ *C30B 23/025* (2013.01); *C23C 14/0641* (2013.01); *C23C 14/221* (2013.01);
(Continued)

(58) Field of Classification Search
CPC ............................... C30B 23/02; C30B 23/06
See application file for complete search history.

(56) References Cited

U.S. PATENT DOCUMENTS 5,248,631 A    9/1993  Park et al.
5,291,507 A    3/1994  Haase et al.
(Continued)

FOREIGN PATENT DOCUMENTS

WO    2006/034540    4/2006

OTHER PUBLICATIONS

Search report from EP Application No. EP16812470 dated Dec. 14, 2018 (11 pages).

(Continued)

*Primary Examiner* — Robert M Kunemund
(74) *Attorney, Agent, or Firm* — Troutman Pepper Hamilton Sanders LLP; Ryan A Schneider

(57) ABSTRACT

Systems and methods for the rapid growth of Group III metal nitrides using plasma assisted molecular beam epitaxy. The disclosure includes higher pressure and flow rates of nitrogen in the plasma, and the application of mixtures of nitrogen and an inert gas. Growth rates exceeding 8 μm/hour can be achieved.

24 Claims, 11 Drawing Sheets

Related U.S. Application Data

(60) Provisional application No. 62/180,167, filed on Jun. 16, 2015.

(51) Int. Cl.
  *C30B 29/40* (2006.01)
  *C23C 16/50* (2006.01)
  *C23C 16/30* (2006.01)
  *C23C 16/452* (2006.01)
  *C23C 14/06* (2006.01)
  *C23C 14/22* (2006.01)
  *C30B 31/06* (2006.01)

(52) U.S. Cl.
  CPC .......... *C23C 16/303* (2013.01); *C23C 16/452* (2013.01); *C23C 16/50* (2013.01); *C30B 23/02* (2013.01); *C30B 29/406* (2013.01); *C30B 31/06* (2013.01); *H01L 21/0242* (2013.01); *H01L 21/0254* (2013.01); *H01L 21/02458* (2013.01); *H01L 21/02576* (2013.01); *H01L 21/02631* (2013.01)

(56) References Cited

U.S. PATENT DOCUMENTS

| | | |
|---|---|---|
| 6,073,578 A | 6/2000 | Shim et al. |
| 6,869,806 B2 | 3/2005 | Cui et al. |
| 10,526,723 B2* | 1/2020 | Doolittle ............... C23C 14/221 |
| 2014/0339085 A1* | 11/2014 | Bouyer ............... H01M 4/0471 |
| | | 204/509 |

OTHER PUBLICATIONS

Gunning, Brendan, et al., "Control of Ion Content and Nitrogen Species Using a Mixed Chemistry Plasma for GaN Grown at Extremely High Growth Rates >9 [mu] m/h by plasma-assisted Molecular Beam," Journal of Applied Physics vol. 118, No. 15, Oct. 21, 2015.

Kosaraju, et al., "The Role of Argon in Plasma-Assisted Deposition of Indium Nitride," Journal of Crystal Growth, vol. 286, No. 2, Jan. 15, 2006, pp. 400-406.

McSkimming, et al., "Plasma Assisted Molecular Beam Epitaxy of GaN with Growth Rages . 2.6 μmh," Journal of Crystal Growth, vol. 386, Oct. 16, 2013.

* cited by examiner

|               | Old Condition 712 holes, 1.3 sccm and ~1.3 μm/hour |           |          |            |
|---------------|---------------------------------------------------:|-----------|---------:|------------|
| D=            | 0.008                                              | inches    |          |            |
| D=            | 0.02032                                            | cm        |          |            |
| # Holes=      | 712                                                |           |          |            |
| C_orfice=     | 0.0037618                                          | L/Sec     |          |            |
| C_apperture=  | 2.678                                              | L/Sec     |          |            |
| Q=            | 1.3                                                | sccm      |          |            |
| Q=            | 0.016471                                           | Torr-L/Sec or | 2.195947 | Pascals/sec |
| Pdown=        | 1.50E-05                                           | Torr      |          |            |
| Pup=          | 6.16E-03                                           | Torr or   | 6.165    | mTorr      |

FIG. 7

|               | New Condition 4000 holes, 20 sccm and ~8 μm/hour |           |         |       |
|---------------|-------------------------------------------------:|-----------|--------:|-------|
| D=            | 0.008                                            | inches    |         |       |
| D=            | 0.02032                                          | cm        |         |       |
| # Holes=      | 4000                                             |           |         |       |
| C_orfice=     | 0.0037618                                        | L/Sec     |         |       |
| C_apperture=  | 15.047                                           | L/Sec     |         |       |
| Q=            | 20                                               | sccm      |         |       |
| Q=            | 0.2534                                           | Torr-L/Sec |        |       |
| Pdown=        | 1.50E-05                                         | Torr      |         |       |
| Pup=          | 1.69E-02                                         | Torr or   | 16.855  | mTorr |

FIG. 8

SYSTEM AND METHOD FOR INCREASING GROUP III-NITRIDE SEMICONDUCTOR GROWTH RATE AND REDUCING DAMAGING ION FLUX

CROSS-REFERENCE TO RELATED APPLICATIONS

This Application is a continuation of U.S. application Ser. No. 15/738,458 filed 20 Dec. 2017 (now U.S. Pat. No. 10,526,723), which is a US National Stage Entry of International Application No. PCT/US16/37930 filed 16 Jun. 2016, which claims the benefit of U.S. Provisional Patent Application No. 62/180,167, filed 16 Jun. 2015, the entire contents and substance of which are hereby incorporated by reference as if fully set forth below.

STATEMENT REGARDING FEDERALLY SPONSORED RESEARCH OR DEVELOPMENT

This invention was made with government support under Grant No. EEC1041895 awarded by the National Science Foundation. The government has certain rights in the invention.

THE NAMES OF THE PARTIES TO A JOINT RESEARCH AGREEMENT

Not Applicable

SEQUENCE LISTING

Not Applicable

STATEMENT REGARDING PRIOR DISCLOSURES BY THE INVENTOR OR A JOINT INVENTOR

Not Applicable

BACKGROUND OF THE INVENTION

The various embodiments of the disclosure relate generally to processes, methods, and systems for plasma-assisted molecular beam epitaxy (MBE). It is particularly useful for the rapid production of Group III-nitride semiconductors.

Group III-nitride semiconductors have seen enormous commercial growth in recent years for solid state lighting and power electronics. While the majority of light emitting diodes (LEDs) are grown by metalorganic chemical vapor deposition (MOCVD), molecular beam epitaxy (MBE) has seen success in the power electronics market for the growth of high electron mobility transistors (HEMTs) and promises expansion of light emitters to wavelengths currently challenging for MOCVD. Plasma-assisted MBE (PAMBE) typically uses radio frequency (RF) plasma to generate reactive nitrogen species from inert nitrogen gas. PAMBE using RF plasma has been shown to result in higher growth rates and improved surface morphology compared to other plasma techniques owing to lower ion content and reduced surface damage during growth.

Nonetheless, PAMBE is typically performed at growth rates on the order of 0.1 to 1 µm/hour, substantially lower than the growth rates typically used in MOCVD growth of GaN which commonly exceed 1-3 µm/hour. These relatively low growth rates limit the applicability of PAMBE for many device structures which require thick buffer layers to reduce defect densities resulting from heteroepitaxy. Although the ultra-clean environment of MBE can be beneficial for the thick, undoped drift regions of p-i-n rectifiers or LEDs, the slow growth rates still preclude the use of MBE for such devices.

Further, if Group III-nitrides, with their tunable band gap and strong light absorption, are ever to become viable for solar applications, thick indium-bearing layers must be demonstrated in order to reduce defect densities. Such layers with high indium mole fractions are impractical in MOCVD due to the low temperature requirements for growing indium bearing alloys, while high temperatures are required for cracking ammonia. The result for most MOCVD growth of InGaN is very low growth rates and highly inefficient precursor usage. Contrarily, these high indium composition alloys are dramatically more suitable for PAMBE where substrate temperatures can be reduced in order to facilitate proper indium incorporation and no ammonia cracking is required. If rapid growth of indium-bearing layers can be achieved, then the potential of Group III-nitrides for photovoltaics improves dramatically.

U.S. Pat. No. 5,248,631 discloses doping IIB-VIA semiconductors during molecular beam epitaxy using neutral free radicals. As understood by those of skill in the art, the doping of films via plasma sources is distinct from the growth of films via a plasma source. For example only, referring to use of a nitrogen plasma, doping uses 100 to 10,000 times a lower nitrogen plasma flux compared to process for the growth of films as disclosed herein. The nitrogen used in U.S. Pat. No. 5,248,631 is not a major component of the films grown (i.e., occurs at small dopant levels, for example, 1 part in 1000 or less) and thus, the potential for ion damage is not as important or even detectable in that process as compared to the present invention's growth processes, where in an exemplary embodiment nitrogen is a major part of the compound.

The beam of U.S. Pat. No. 5,248,631 is non-neutral, although the disclosure assumes neutral radical operation because the measured damage in the film (which is controlled by many factors not just N-radical content) is reduced.

In patentable contract, the present invention seeks to increase growth rates, which inherently involves increasing, in the above description, the nitrogen plasma flow rates without introducing damaging ions. Thus, the present invention can have nitrogen flow rates of a million times or higher than the flows associated with doping.

U.S. Pat. No. 6,073,578 discloses use of an electrostatic bias to repel ions and prevent them from striking the growth chamber. As those of skill in the art can appreciate, processes using electrostatic means must ignore the fact that ions come in both positive and negative varieties. Any bias that repels one, enhances the kinetic energy of the other. Yes, this cannot be ignored because of the damaging effects of the electrons emanating from the plasma. In patentable contract, the present invention seeks to increase growth rates, which inherently involves increasing, for example, nitrogen plasma flow rates without introducing damaging ions of any polarity. For this reason, simple electrostatic repulsion cannot be implemented.

International Publication No. WO2006034540 discloses the behavior for the higher-pressure regimes associated with chemical vapor deposition (CVD) (typical Torr pressures as described by all examples) compared to those associated with MBE (typically $10^{-8}$-$10^{-12}$ Torr). The gas streams of the CVD system disclosed is thus at least a million times more likely to have fewer ions based solely on gas pressure alone. This is because it is well known that the average length between a gas collision (gas collisions are the primary mechanism to neutralize the ionic content) is inversely related to pressure. For air at 760 Torr, the average length between gas collisions is $6.5 \times 10^{-6}$ cm. Thus, the MBE case is a million times harder to neutralize ions, and hence the need for the present invention.

Further, given that gas travel lengths of ~20 cm are disclosed in WO2006034540, the gas undergoes millions of neutralizing collisions prior to arriving at the growth substrate, and no amount of neutralizing nozzle or baffle are needed. Given the millions of gas collisions that occur along the gas path toward the substrate, not only are no ions expected to arrive at the substrate, but the plasma activated gas is also completely neutralized and adds no net benefit other than added and unwanted impurities. Lastly, this disclosure uses an electrostatic approach to control ion content, and thus suffers the same limitations as described above.

BRIEF SUMMARY OF THE INVENTION

In an exemplary embodiment of the present invention, a vacuum deposition method for growing a semiconductor material comprises depositing semiconductor material on a substrate, and growing the thickness of the semiconductor material at a growth rate of greater than 3 μm/hour.

The growth rate can be greater than 4 μm/hour. The growth rate can be greater than 8 μm/hour.

The method can further comprise flowing a plasma though a gas-conductance barrier, wherein growing the thickness of the semiconductor material occurs downstream of the gas-conductance barrier.

The method can further comprise generating a plasma upstream of a gas-conductance barrier, and flowing the plasma though the gas-conductance barrier, wherein growing the thickness of the semiconductor material occurs downstream of the gas-conductance barrier.

The method can further comprise flowing a plasma from a plasma chamber, though a gas-conductance barrier, and into a growth chamber, wherein the semiconductor material is a group III metal nitride product, wherein the group III metal nitride product is grown in the growth chamber, wherein the gas conductance barrier has a conductance C such that the growth chamber pressure $P_g$ is lower than the plasma chamber pressure $P_P$, and wherein $P_P$ is at least 1 mTorr.

$P_P$ can be at least 10 mTorr. $P_P$ can be at least 100 mTorr.

The plasma can comprise nitrogen. The plasma can comprise nitrogen and argon.

The method can further comprise flowing a plasma from a plasma chamber, though a gas-conductance barrier, and into a growth chamber, and reducing the ion content of the plasma, wherein the semiconductor material is a group III metal nitride product, and wherein the group III metal nitride product is grown in the growth chamber.

Reducing the ion content of the plasma can comprise providing the plasma with a pressure of at least about 1 mTorr. Reducing the ion content of the plasma can comprise seeding the plasma with an inert gas.

In another exemplary embodiment of the present invention, a vacuum deposition method for growing a semiconductor material comprises flowing a plasma from a plasma chamber, though a gas-conductance barrier, and into a growth chamber, and growing a semiconductor material in the growth chamber, wherein the pressure of the plasma is at least about 1 mTorr.

The growth rate of the semiconductor material can be greater than 3 μm/hour. The growth rate of the semiconductor material can be greater than 4 μm/hour. The growth rate of the semiconductor material can be greater than 8 μm/hour.

In another exemplary embodiment of the present invention, a vacuum deposition system for growing a semiconductor material according to a method above can comprise a growth chamber having a substrate for growing the semiconductor material, a remote vacuum chamber, and a gas-conductance barrier separating the vacuum chamber from the growth chamber.

The system can be configured such that a nitrogen gas flow of a plasma formed in the remote vacuum chamber is scaled based on the equation $$\mathrm{SCCM}=(\mathrm{GR})*(\mathrm{AREA})/\mathrm{SCALE}$$

wherein:
GR is the growth rate of the semiconductor material in μm/hour;
AREA is the size of the substrate in inches^2; and
SCALE is a factor with units (μm inches^2)/(SCCM-hour) between 0.1 and 50.

Regarding this inventive concept of scale alone, unassociated with a particular embodiment of the present invention, the inventive scaling of plasma sources is used to increase flow/deposition area without the introduction of harmful added ion content and subsequent damage in the films.

More generally, the present invention advantageously benefits from a flow rate (governed by the conductance of the aperture) that controls how the systems are scaled to higher deposition area, manipulating the upstream plasma pressure, which controls how much of the harmful ions are snuffed out and thus never make it into the growth chamber (through the conductance aperture), and can provide a vacuum deposition system with deposition rates greater than 3 μm/hour.

In other exemplary embodiments of the present invention, the processes, methods, and systems are for rapidly growing Group III metal nitrides in an PAMBE process.

An embodiment of the disclosure can be a PAMBE system having a growth chamber with a substrate therein, a remote plasma chamber, and a gas-conductance barrier separating the plasma chamber from the growth chamber. The plasma can contain nitrogen and an inert gas mixture. The growth chamber can have a pressure $P_G$, and the plasma chamber has a pressure $P_P$, and the gas conductance barrier allows the pressure $P_G$ to be lower that $P_P$.

In some embodiments, $P_P$ can be at least 0.1 mTorr, at least 1 mTorr, at least 10 mTorr, or at least 100 mTorr. In some embodiments, the $P_G$ can be less than about 0.1 mTorr, or less than about 0.05 mTorr. In one example, $P_P$ can be at least 5 mTorr, and $P_G$ can be less than about 0.1 mTorr.

In some embodiment, the nitrogen gas flow of the plasma can be at least 3 SCCM based on a 2-inch diameter substrate. The nitrogen gas flow can be scaled to larger systems based on the equation SCCM=(GR)*(AREA)/SCALE, where GR is the growth rate in μm/hour, AREA is the size of the target in square inches, and SCALE is a factor with units (μm inches^2)/(SCCM-hour), wherein SCALE is between 0.1 and 50, between 1 and 50, or between 1 and 20.

In some embodiments, the plasma can contain nitrogen gas and an inert gas. The inert gas can be selected from helium, neon, argon, xenon, and krypton, preferably from helium neon, argon and xenon. The inert gas can be selected from the group consisting of argon and xenon. The plasma can include nitrogen gas and argon. In some embodiment, the nitrogen to inert gas ratio can be 1:20 to 20:1, or 1:1 to 10:1.

In some embodiments, the gas-conductance barrier has a conductance value of at least about 7 L/sec, about 10 L/sec, or about 15 L/sec. In some embodiments, the gas-conductance barrier can have a conductance value of at least about 5 L/sec or 10 L/sec. The conductance value can be scaled by $r^2$, where r is the platter size in a multi-wafer system or the wafer size in a single wafer system.

In some embodiments, the substrate can include a Group III metal nitride. The Group III metal nitride can include GaN, InN, AlN, or combinations thereof. The substrate can include a Group III metal nitride growing at a rate of at least 3 μm/hour, at a rate of at least 4 μm/hour, or at least about 8 μm/hour. The substrate can also include an n-type dopant, such as germanium.

Another embodiment of the disclosure can be a method for growing Group III metal nitrides, wherein the method includes the steps of generating a plasma in a remote plasma chamber; flowing the plasma through a gas-conductance barrier and into a growth chamber; and growing a Group III metal nitride product on a substrate in the growth chamber. The growth rate of the Group III metal nitride product can be greater than 1 μm/hour, greater than 3 μm/hour, greater than 4 μm/hour, or greater than 8 μm/hour.

In some embodiment, the plasma can contain a combination of nitrogen and an inert gas. The inert gas can be selected from helium, neon, argon, xenon, and krypton, preferably from neon, argon and xenon. The inert gas can be selected from the group consisting of argon and xenon. The plasma can include nitrogen gas and argon. In some embodiment, the nitrogen to inert gas ratio can be 1:20 to 20:1, or 1:1 to 10:1.

In the method, the nitrogen gas flow of the plasma can be at least 3 SCCM based on a 2-inch diameter substrate. The nitrogen gas flow can be scaled to large systems based on the equation SCCM=(GR)*(AREA)/SCALE, where GR is the growth rate in μm/hour, AREA is the size of the target in square inches, and SCALE is a factor with units (μm inches^2)/(SCCM-hour). SCALE can be between 0.1 and 50, between 1 and 50, or between about 1 and 20.

In some embodiments, $P_P$ can be at least 0.1 mTorr, at least 1 mTorr, at least 10 mTorr, or at least 100 mTorr. In some embodiments, the $P_G$ can be less than about 0.1 mTorr, or less than about 0.05 mTorr. In one example, $P_P$ can be at least 5 mTorr, and $P_G$ can be less than about 0.1 mTorr.

In some embodiments, the gas-conductance barrier can have a conductance value of at least about 5 L/sec, 7 L/sec or 10 L/sec. The conductance value can be scaled by $r^2$, where r is the platter size in a multi-wafer system or the wafer size in a single wafer system.

In some embodiments, the method can include growing a Group III metal nitride including GaN, InN, AlN, or combinations thereof. The Group III metal nitride can be grown at a rate of at least 3 μm/hour, at a rate of at least 4 μm/hour, or at least about 8 μm/hour.

In some embodiments, the method can further include doping the Group III metal nitride with an n-type dopant, including with germanium.

An embodiment of the disclosure can include a method for increasing the growth rate of Group III nitrides in plasma-assisted MBE, wherein a nitrogen plasma can be seeded with an inert gas, and the nitrogen flow rate can be at least 5 SCCM. The nitrogen gas flow can be scaled to large systems based on the equation SCCM=(GR)*(AREA)/SCALE, where GR is the growth rate in μm/hour, AREA is the size of the target in square inches, and SCALE is a factor with units (μm inches^2)/(SCCM-hour). SCALE can be between 0.1 and 50, between 1 and 50, or between about 1 and 20. The inert gas can be selected from the group consisting of helium neon, argon and xenon. In some embodiments, the ratio of nitrogen to inert gas can be at least 5:1, or at least 10:1. The ratio of nitrogen to inert gas can be between about 5:1 to about 20:1.

An embodiment of the disclosure can include, in method for growing Group III metal nitrides by plasma-assisted MBE using nitrogen gas in the plasma, the improvement comprising reducing the ion content of the plasma by increasing the pressure of the plasma to at least about 1 mTorr. The method can further include adding an inert gas to the nitrogen plasma, the inert gas selected from the group consisting of helium, neon, argon and xenon, or can be argon. The ratio of the inert gas can be at least about 5:1, or at least about 10:1. The ratio of nitrogen to inert gas can be between about 5:1 to about 20:1. The nitrogen flow rate can be at least 5 SCCM, and can be scaled based on the equation SCCM=(GR)*(AREA)/SCALE, as described herein.

BRIEF DESCRIPTION OF THE SEVERAL VIEWS OF THE DRAWING

FIG. 7 illustrates a table of operating conditions for the present invention in accordance with an exemplary embodiment of the disclosure.

FIG. 8 illustrates a table of operating conditions for the present invention in accordance with an exemplary embodiment of the disclosure.

DETAILED DESCRIPTION OF THE INVENTION

Figure 1A:
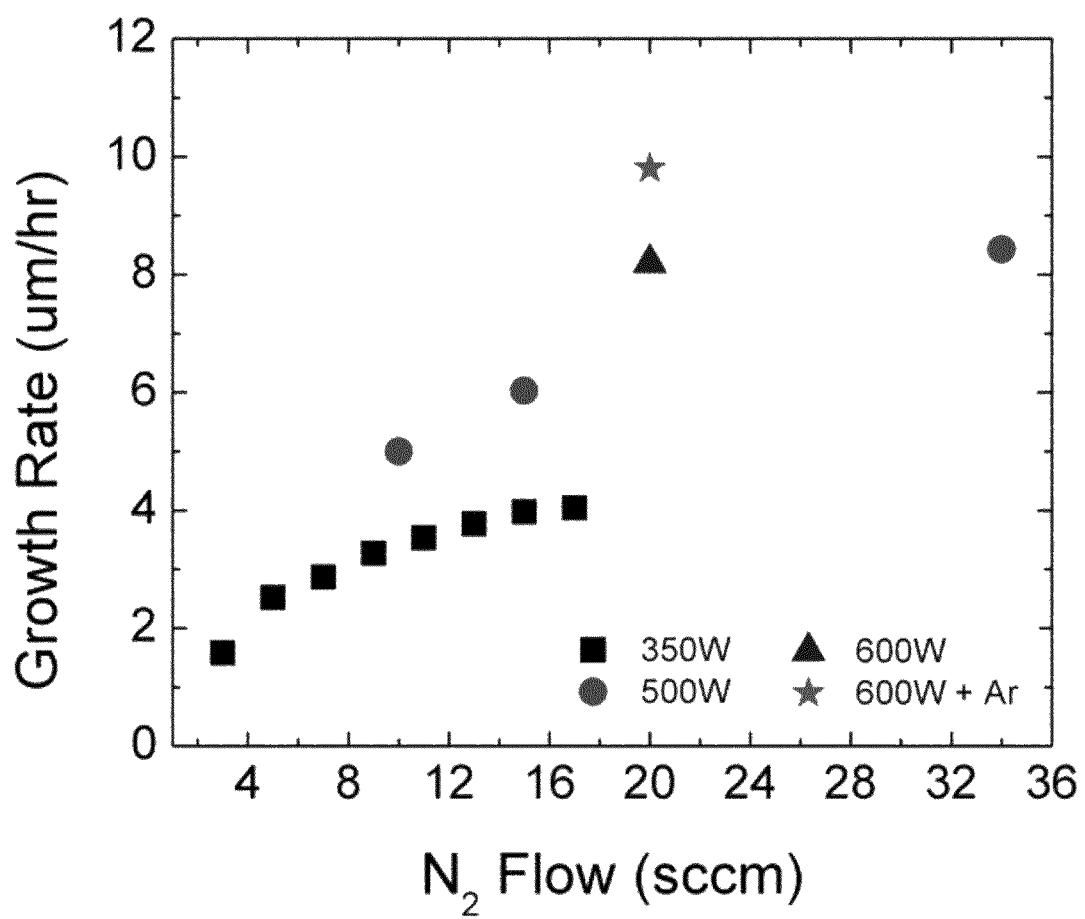
FIGS. 1A and 1B illustrate growth rates of gallium nitride under various conditions, in accordance with an exemplary embodiment of the disclosure.

Although preferred embodiments of the disclosure are explained in detail, it is to be understood that other embodiments are contemplated. Accordingly, it is not intended that the disclosure is limited in its scope to the details of construction and arrangement of components set forth in the following description or illustrated in the drawings. The disclosure is capable of other embodiments and of being practiced or carried out in various ways. Also, in describing the preferred embodiments, specific terminology will be resorted to for the sake of clarity.

It must also be noted that, as used in the specification and the appended claims, the singular forms "a," "an" and "the" include plural referents unless the context clearly dictates otherwise.

Also, in describing the preferred embodiments, terminology will be resorted to for the sake of clarity. It is intended that each term contemplates its broadest meaning as understood by those skilled in the art and includes all technical equivalents which operate in a similar manner to accomplish a similar purpose.

Ranges can be expressed herein as from "about" or "approximately" one particular value and/or to "about" or "approximately" another particular value. When such a range is expressed, another embodiment includes from the one particular value and/or to the other particular value.

By "comprising" or "including" is meant that at least the named compound, element, particle, or method step is present in the composition or article or method, but does not exclude the presence of other compounds, materials, particles, method steps, even if the other such compounds, material, particles, method steps have the same function as what is named.

It is also to be understood that the mention of one or more method steps does not preclude the presence of additional method steps or intervening method steps between those steps expressly identified. Similarly, it is also to be understood that the mention of one or more components in a device or system does not preclude the presence of additional components or intervening components between those components expressly identified.

The disclosure includes a technique for extremely high growth rates in PAMBE growth of Group III metal nitrides, including for example GaN, while maintaining a smooth surface microstructure. By adding pumping capacity and a minor modification to the plasma source, a broad range of growth rates can be achieved, while a mixed chemistry plasma shows a further enhancement of the growth rate. Suppression of ion content can be achieved by higher plasma pressure and through argon dilution. A growth rate of 9.8 μm/hour in an exemplary system represents more than an order of magnitude increase compared to traditional growth rates in MBE, and even exceeds those commonly used in MOCVD.

The disclosure includes a PAMBE system that has a growth chamber, a remote plasma chamber, and a gas conductance barrier separating the growth chamber and the plasma chamber. The growth chamber operates at a pressure $P_G$, and the plasma chamber operates at a pressure $P_P$. However, unlike previous systems, the gas conductance barrier, or aperture, provides a much higher conductance of gas flow between the two chambers. The gas conductance barrier can be at least three times the conductance of a traditional system, at least four times the conductance of a traditional system, or at least five times the conductance of a traditional system. By increasing the conductance of the barrier, a larger flow rate of gas into the plasma can be achieved, which leads to the increased growth rates. A pressure differential of the two chambers should still be maintained in the system.

One embodiment of the disclosure then includes the pressure of the plasma chamber, designated $P_P$. The plasma chamber pressure can be at least about 0.1 mTorr, at least about 1 mTorr, at least about 10 mTorr, at least about 50 mTorr, at least about 100 mTorr, or at least about 250 mTorr. An upper limit of the plasma chamber pressure can depend on the nature of the plasma chamber and the RF power used. However, one of ordinary skill would understand that the upper limit could be at a pressure sufficient to maintain the plasma in a "bright mode" (often referred to as inductive mode), i.e. before it switched to a "dim mode" (often referred to as capacitive mode) or fully extinguished. The plasma chamber pressure could therefore be less than 3 Torr, less than 2 Torr, or less than about 1 Torr.

One embodiment of the disclosure then includes the pressure of the growth chamber, designated $P_G$. The growth chamber pressure can be less than $P_P$, less than about 0.1 mTorr, less than about 0.08 mTorr, less than about 0.07 mTorr, or less than about 0.05 mTorr. The growth chamber pressure can be greater than about 0.005 mTorr.

The gas flow in this disclosure can be maintained at a rate high enough to maintain the plasma and drive preferred grow rates. One of ordinary skill would appreciate that the flow (Q, in torr-liters/second), conductance (C, in liters/second) and pressures ($P_P$ and $P_G$, in torr) are governed by the relationship $Q=C(P_P-P_G)$, often approximated by $Q=CP_P$, when $P_P \gg P_G$. In an exemplary system, based on a 2-inch target, the nitrogen gas flow rate can be greater than 3 SCCM, greater than 4 SCCM, or greater than 5 SCCM. The nitrogen gas flow rate can be greater than 8 SCCM, greater than 9 SCCM or greater than 10 SCCM. The nitrogen gas flow rate can be less than 50 SCCM, less than 45 SCCM, or less than 40 SCCM in the exemplary system for a 2-inch target. The nitrogen gas flow rate can be between about 3 SCCM and about 40 SCCM, between about 3 SCCM and about 35 SCCM, between about 8 and about 35 SCCM, or between about 10 and about 35 SCCM, in an exemplary system for a 2-inch target.

One of skill in the art will recognize that nitrogen gas flow rates described above, while still above the traditional range of less than 1 to about 3 SCCM in a similar system, will depend entirely on the size of system in which the gas is being applied to—a larger system would have an inherently larger flow rate. Moreover, several practical aspects of PAMBE add some error to the value, including particularly the amount of spray past the substrate, the net desorption (non-sticking nitrogen) of nitrogen off the substrate and the efficiency of the plasma in generating reactive species. Nonetheless, the flow rates above can be scaled according to the system in which they are applied. The mass transport, SCCM in units of standard cubic centimeters per minute (SCCM), of the system can be scaled according to the equation SCCM=(GR)*(AREA)/SCALE, where GR is the growth rate in um/hour, AREA is the size of the target in square inches, and SCALE is a factor with units (μm inches^2)/(SCCM-hour) that accounts for the fact that not all the gas is incorporated in the growing film, some having missed the substrate, some desorbed from the substrate and also accounting for the percent activation of the plasma. The SCALE can be between about 0.1 to 50, from about 1 to 50, from about 1 to 20, from about 1 to 10, from about 2 to 10, or from about 1 to about 5.

Another aspect of the disclosure is the gas conductance barrier separating the plasma chamber from the growth chamber. The gas conductance barrier has a conductance associated with it which can vary with the size of the system. In an embodiment of the disclosure, the conductance of the barrier can be between about 1 L/sec and 100 L/sec. The conductance can be greater than about 2 L/sec, greater than about 3 L/s, or greater than about 5 L/sec. The conductance can be greater than about 7 L/sec, greater than about 10 L/s, or greater than about 15 L/sec. The conductance can be less than about 90 L/sec, less than about 75 L/sec, or less than about 50 L/sec. In an embodiment, the conductance can be from about 2 L/sec to about 90 L/sec, from about 3 L/sec to about 75 L/sec, from about 4 L/sec to about 60 L/sec, or from about 5 L/sec to about 50 L/sec. In an embodiment, the conductance can be from about 10 L/sec to about 90 L/sec, from about 10 L/sec to about 75 L/sec, from about 10 L/sec to about 60 L/sec, or from about 10 L/sec to about 50 L/sec. One of skill in the art will recognize that larger systems can be scaled for larger conductance values. That conductance value, like the gas flow, can increase at $r^2$ where r is the platter size in a multi-wafer system or the wafer size in a single wafer system.

As demonstrated in further detail below, a high growth rate and high quality of the Group III metal nitride structures can be achieved using a pure nitrogen plasma. However, as the pressure from the decreased gas flow decreases further, detrimental effects to the substrates can be observed due to high energy species created when operating at lower nitrogen pressures. This ion content should be controlled in order to achieve high quality Group III-nitrides. By including an inert gas flow into the nitrogen stream, the ion content can be reduced, by either changing the electron temperature of the plasma or in other cases, operating at a higher plasma pressure where the mean free path between collisions is minimized, and even higher grow rates can be achieved. The last feature is likely due to an effective higher electron temperature of the plasma when the inert gas is present. Thus, an embodiment of the disclosure includes a plasma that includes nitrogen gas and an inert gas. The inert gas can be helium, neon, argon xenon or krypton. The inert gas can be neon, argon or xenon. The inert gas can be argon or xenon, or argon or helium, or can be argon or can be helium. The ratio of gas flows for nitrogen to inert gas can be from 99:1 to 1:99. The ratio for nitrogen to inert gas can be from 20:1 to 1:20, from 10:1 to 1:10, or from 5:1 to 1:5. The ratio for nitrogen to inert gas can be from 20:1 to 1:1. The ratio for nitrogen to inert gas can be from 20:1 to 3:2, or from 20:1 to 2:1. In some embodiments, the nitrogen to inert gas ratio is greater than 3:2, greater than 2:1, greater than 3:1, greater than 4:1, or greater than 5:1. As used here, the ratio is for the gas flows of nitrogen and inert gas, e.g. SCCM $N_2$:SCCM inert gas. Uses of highly dilute nitrogen in the inert gas have the opposite effect, reducing growth rates, providing a net wider growth rate range.

The RF power can be any RF power used to generate a plasma. In an embodiment, the RF power can be between about 300 W and about 650 W, between about 350 W and about 650 W, or between about 350 W and about 600 W. It is well known in the art that what is important about these powers is the power density not the absolute power. Thus, for larger systems, these powers scale with the volume of the plasma chamber wherein the present embodiment's current plasma chamber is ~1-inch diameter×4-inch long cylindrical.

For some embodiments described herein, the high growth rates can be achieved for substrate temperatures from about 300° C. to about 1400° C. The substrate temperature can be between about 300 and about 800° C., between about 300 and about 650° C., between about 300 and about 1000° C., between about 500 and about 1200° C., between about 500 and about 800° C., between about 600 and about 1000° C.

The disclosure herein can be used to rapidly grow Group III metal nitride structures. The Group III metal nitride can be AlN, GaN, or InN, and mixed metal combinations thereof, such as InGaN, AlGaN, or InGaAlN. In some embodiments, the Group III metal nitride can include InN or GaN, or can be GaN.

The disclosure herein includes growth rates of Group III metal nitrides substantially above traditional MBE rates. The growth rate can be at least about 1 µm/hour, at least about 2 µm/hour, or at least about 3 µm/hour. The growth rate can be at least about 5 µm/hour, or at least about 8 µm/hour.

Several different aspects of the disclosure can thus be discussed. One embodiment of the disclosure can include a system for performing PAMBE, wherein the system includes a growth chamber, which has a substrate mounted therein; a plasma chamber separated from the growth chamber, and a gas conductance barrier separating the plasma chamber and the growth chamber. The pressures of the two chambers, the conductance of the barrier, and the gases used to create the plasma are as described above.

Another embodiment can be a Group III metal nitride rapid growth PAMBE system. The system can have growth chamber that grows the Group III metal nitride on a substrate mounted therein. The system can have a nitrogen gas plasma chamber separated from the growth chamber, and a gas conductance barrier separating the plasma chamber and the growth chamber. The pressures of the two chambers, the conductance of the barrier, and the gases used to create the plasma are as described above. The rapid growth can be at a rate of at least about 1 µm/hour, at least about 2 µm/hour, or at least about 3 µm/hour. The growth rate can be at least about 5 µm/hour, at least about 7 µm/hour, at least about 8 µm/hour, or at least about 9 µm/hour. The Group III metal nitride can be AlN, GaN, or InN, and mixed metal combinations thereof, such as InGaN, AlGaN, or InGaAlN; preferably InN or GaN, or can be GaN.

The disclosure also provides for a method of growing Group III metal nitrides, wherein the method comprises generating a plasma in a PAMBE system, flowing the plasma through a gas conductance barrier into a growth chamber, and growing a Group III metal nitride on a substrate in the growth chamber. The growth rate of the Group III metal nitride can be greater than 1 µm/hour, greater than about 2 µm/hour, or greater than about 3 µm/hour. The growth rate can be at least about 5 µm/hour, or at least about 8 µm/hour.

The plasma in the method can comprise a nitrogen gas, or can comprise a combination of nitrogen and an inert gas mixture. The inert gas, the ratio of nitrogen to inert gas, and the flow rate of the gas can be as described above.

The method includes a pressure in the plasma chamber, which can be defined at $P_P$, and is as described above. Similarly, the method includes a pressure in the growth chamber, $P_G$, as described above. The substrate in the growth chamber can be at a substrate temperature as described above.

Another embodiment of the disclosure includes a method of reducing the ion content of a nitrogen plasma in an PAMBE system. The method includes increasing the pressure of the plasma to at least 1 mTorr, or at least 10 mTorr, or at least 100 mTorr. The method includes feeding an inert gas into the nitrogen plasma at a ratio of nitrogen to inert gas of 99:1 to 1:99. The ratio for nitrogen to inert gas can be from 20:1 to 1:20, from 10:1 to 1:10, or from 5:1 to 1:5. The ratio for nitrogen to inert gas can be from 20:1 to 1:1. The ratio for nitrogen to inert gas can be from 20:1 to 3:2, or from 20:1 to 2:1. In some embodiments, the nitrogen to inert gas ratio is greater than 3:2, greater than 2:1, greater than 3:1, greater than 4:1, or greater than 5:1. The method of reducing ion content in the nitrogen plasma can include forming the plasma in a plasma chamber, flowing the plasma through a gas conductance barrier into a growth chamber, and growing a Group III metal nitride on a substrate in the growth chamber. The growth rate of the Group III metal nitride can be greater than 1 µm/hour, greater than about 2 µm/hour, or greater than about 3 µm/hour. The growth rate can be at least about 5 µm/hour, or at least about 8 µm/hour.

Some exemplary embodiments of the systems and the methods can then be described. The system and/or method can include a nitrogen:inert gas mixture of between 10:1 and 1:1, a growth rate of a Group III metal nitride of at least 3 µm/hour, and a metal nitride comprising GaN. The system and/or method can include a nitrogen:inert gas mixture of between 10:1 and 2:1, a growth rate of a Group III metal nitride of at least 3 µm/hour, and a metal nitride comprising GaN. The system or method can include a nitrogen gas flow rate for a 2-inch substrate of at least about 7 SCCM, at least about 10 SCCM, or at least about 15 SCCM. The growth rate of a Group III metal nitride can be at least 5 µm/hour, at least 6 µm/hour, at least 7 µm/hour, or at least 8 µm/hour. The ion content based on a probe current can be reduced by at least about 15%, at least about 25%, at least about 33%, at least about 50%, at least about 66%, or at least about 75%.

The system and methods described above can also be used to add a n-type dopant in the PAMBE system to the rapidly growing Group III metal nitride. The methods can include further doping a growing metal nitride with an n-type dopant. The systems can include the metal nitride grown on the substrate, which further includes an n-type dopant. The n-type dopant be any metal Applicable to the PAMBE process. The n-type dopant can preferably be germanium.

Utilizing a modified nitrogen plasma source, plasma assisted molecular beam epitaxy (PAMBE) has been used to achieve higher growth rates in GaN. A modified conductance aperture plate, combined with higher nitrogen flow and added pumping capacity, resulted in dramatically increased growth rates up to 8.4 µm/hour using 34 SCCM of $N_2$ while still maintaining acceptably low operating pressure. It was further discovered that argon could be added to the plasma gas to enhance growth rates up to 9.8 µm/hour which was achieved using 20 SCCM of N2 and 7.7 SCCM Ar flows at 600 W RF power. A remote Langmuir style probe employing the flux gauge was used to indirectly measure the relative ion content in the plasma. The use of argon dilution at low plasma pressures resulted in a dramatic reduction of the plasma ion current by more than half, while high plasma pressures suppressed ion content regardless of plasma gas chemistry. Moreover, different trends are apparent for the molecular and atomic nitrogen species generated by varying pressure and nitrogen composition in the plasma. (See FIG. 4.) Argon dilution resulted in nearly an order of magnitude achievable growth rate range from 1 µm/hour to nearly 10 µm/hour. Even for films grown at more than 6 µm/hour, the surface morphology remained smooth showing clear atomic steps with root mean square roughness less than 1 nm. Due to the low vapor pressure of Si, Ge was explored as an alternative n-type dopant for high growth rate applications. Electron concentrations from $2.2 \times 10^{16}$ to $3.8 \times 10^{19}$ $cm^{-3}$ were achieved in GaN using Ge doping, and unintentionally doped GaN films exhibited low background electron concentrations of just $1-2 \times 10^{15}$ $cm^{-3}$. The highest growth rates resulted in macroscopic surface features due to Ga cell spitting which is an engineering challenge still to be addressed. Nonetheless, the dramatically enhanced growth rates demonstrate great promise for the future of Group III-nitride devices grown by PAMBE.

EXAMPLES

Substrate, Apparatus, and Growth Technique

All films, unless otherwise specified, were grown in a Riber 32 MBE system with a base pressure of approximately $8 \times 10^{-11}$ Torr. The substrates were single-side polished 1×1 cm sapphire, 1×1 cm GaN templates, or 2-inch sapphire wafers. All substrates were sputter coated with 2 µm of tantalum on the back side for heat absorption and spreading. After cleaning in a 4:1 solution of $H_2SO_4$:$H_2O_2$, the substrates were loaded into an introductory chamber on an indium-free molybdenum block, and then outgassed at 150° C. for 20 minutes. The samples were then transferred to the growth chamber and were outgassed for an additional ten minutes at 600° C. for the GaN template substrates or 850° C. for the sapphire substrates. Any substrate temperatures listed herein were those measured by thermocouple. For all film growths, nitrogen was supplied by a Veeco UNI-Bulb RF plasma source, with several modifications which will be described later. The gas flow and RF power were varied throughout the study to achieve the desired surface conditions, and also to explore their effects on growth rate. Aluminum was supplied by a cold-lip effusion cell, gallium was supplied by a standard effusion cell and/or a Veeco dual-filament SUMO cell, and germanium was supplied by a standard effusion cell for n-type doping. The total Ga fluxes used in this study varied from $\sim 8 \times 10^{-7}$ Torr beam equivalent pressure (BEP) up to $\sim 3.6 \times 10^{-6}$ Torr BEP.

The growth techniques employed herein were a combination of traditional MBE and a shuttered variation of MBE called Metal-Modulated Epitaxy (MME). For the sapphire substrates, a low-temperature nitridation was performed for one hour at 200° C., followed by a 10 nm nucleation layer under N-rich conditions (III/V≈0.7) at 700° C. Then, a thicker AlN buffer layer was grown using MME at 850° C. under Al-rich conditions (III/V≈1.5), while the substrate temperatures during GaN growth were typically 600 to 650° C. This MME technique has been shown to achieve extremely high p-type doping, control phase separation in InGaN, and result in excellent uniformity and material utilization due to the temperatures substantially lower than traditional PAMBE.

The film growth was monitored in situ by reflection high energy electron diffraction (RHEED), and the plasma emission spectra were monitored through the rear window of the plasma source looking through the pyrolytic boron nitride (PBN) bulb using an Ocean Optics HR-2000+ES spectrometer in the wavelength range of 200-1100 nm. Post-growth structural analysis was performed by x-ray diffraction (XRD) using a Philips X'Pert Pro MRD, and the surface morphology of the films was characterized by a Veeco Dimension 3100 atomic force microscope (AFM) operated in tapping mode. Film thicknesses were verified by either contact profilometry or spectroscopic ellipsometry. Hall Effect was employed to determine the electrical properties of select films using a 0.3 T fixed magnet or a custom Hall effect system with a 1.5 T electro-magnet.

Modifications to Plasma and Chamber

The overall pumping system for the growth chamber consisted of one CTI-8 cryo pump, two CTI-10 cryo pumps all used during growth, and one ion pump and a titanium sublimation pump used when not growing. With the added cryo pumps, the pumping capacity during growth was more than tripled compared to the previous single cryo pump configuration. This increased capacity resulted in a substantial reduction in the chamber pressure during growth, never exceeding $10^{-4}$ Torr even with more than 30 standard cubic centimeters per minute (SCCM) of $N_2$ flow. The lower chamber pressure reduces wear on effusion cell filaments, and could serve to decrease scattering of the incident flux to improve growth rates.

In addition to the added pumping capacity, the plasma source itself was also slightly modified. The original plasma aperture (FIG. 7) was replaced with a custom 5.6× higher conductance aperture (FIG. 8) in order to allow for higher gas flow while maintaining the correct plasma mode. With the original aperture, the plasma switched to a dim mode resulting from excessive back pressure behind the aperture with a nitrogen flow of just 3.25 SCCM, but remained lit in the bright mode with flow less than 1 SCCM. Using the new high-conductance aperture, the plasma required substantially higher nitrogen flow of at least 3 SCCM to remain ignited, but continued in the bright mode up to the maximum tested nitrogen flow of 34 SCCM.

Growth Rate of GaN Using Mixed Nitrogen and Argon Gas

In order to initially characterize the plasma source, the GaN growth rate was determined using post-growth thickness measurements combined with in situ estimation of III/V flux ratios by transient RHEED analysis. The RHEED and post growth methods matched to less than 5% accuracy in all cases. To avoid desorption of the Ga flux, the samples used for growth rate determination were grown at a low substrate temperature of 600° C. under metal-rich conditions. The nitrogen flow was initially varied from 3 SCCM to 17 SCCM with a fixed power of 350 W, and then the plasma power was varied from 350 W to 500 W with a fixed nitrogen flow of 15 SCCM. This resulted in growth rates of 1.5 µm/hour to 6.1 µm/hour. Using pure nitrogen at 500W RF power and increasing the flow to 34 SCCM using a second mass flow controller yielded a growth rate of 8.4 µm/hour.

Figure 1B:
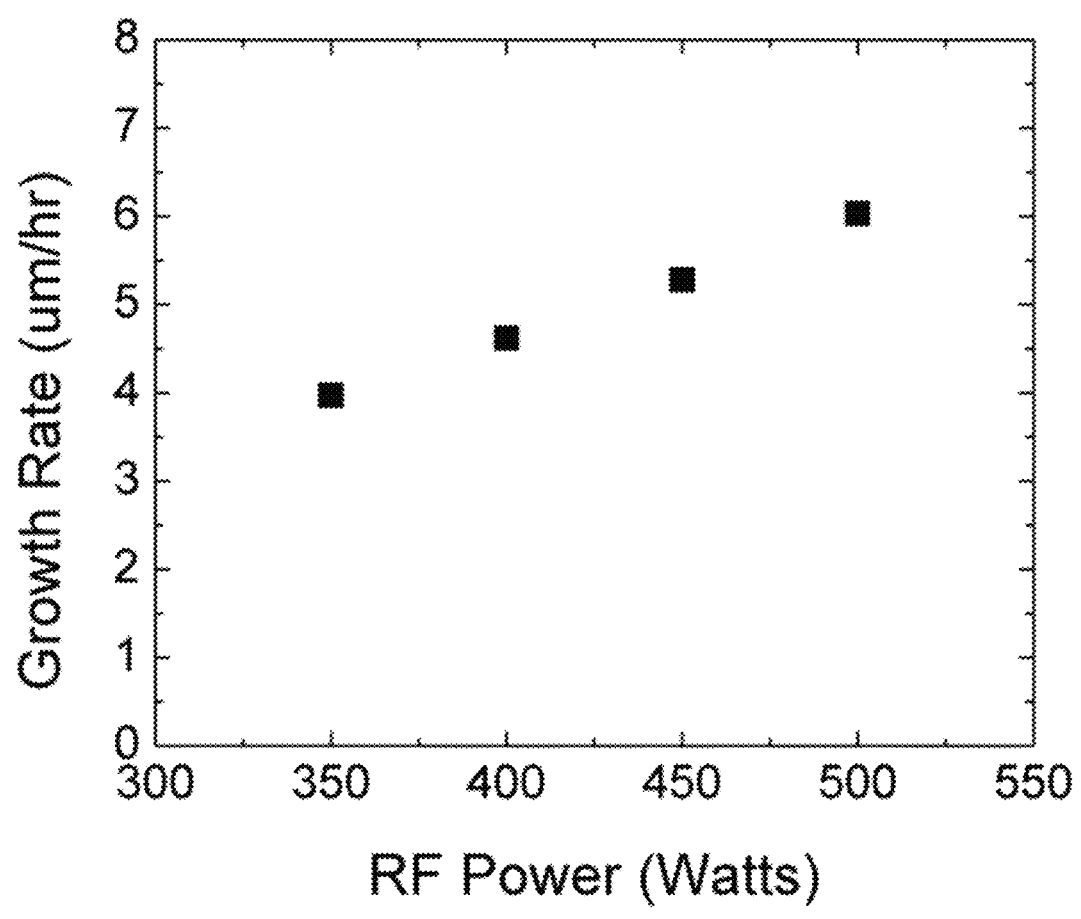

To assist in the initial striking of the plasma after baking the system, a light flow of argon gas was added which is easier to ignite than pure nitrogen. After the plasma ignited, the argon flow was cut off and the plasma transitioned to pure nitrogen. However, it was observed that this procedure resulted in an increase in the active nitrogen flux for films grown immediately after the use of argon. As such, another test was performed to determine the effect of argon on the growth rate for various conditions. From this test, it was discovered that the growth rate increased by approximately 20 to 50 percent at high and low nitrogen flows, respectively, with the addition of 7.7 SCCM argon into the plasma. FIGS. 1A and 1B show the overall growth rate as a function of $N_2$ flow for various power conditions (A) or RF power for a $N_2$ flow of 15 SCCM (B). Growth rates range from approximately 1.5 µm/hour to 9.8 µm/hour.

The maximum growth rate was achieved using 600 W RF power with 20 SCCM nitrogen and 7.7 SCCM argon flows, which is limited by our current mass flow controller hardware configuration. This is not to be considered an ultimate limitation in our embodiment as higher flow rates and thus higher growth rates could be achieved with higher mass flow controllers. This condition resulted in an extremely high growth rate of 9.8 µm/hour which is, to our knowledge, the highest ever reported for GaN grown by MBE. Under this same condition using 20 SCCM nitrogen without argon, the growth rate dropped to 8.2 µm/hour.

Figure 2A:
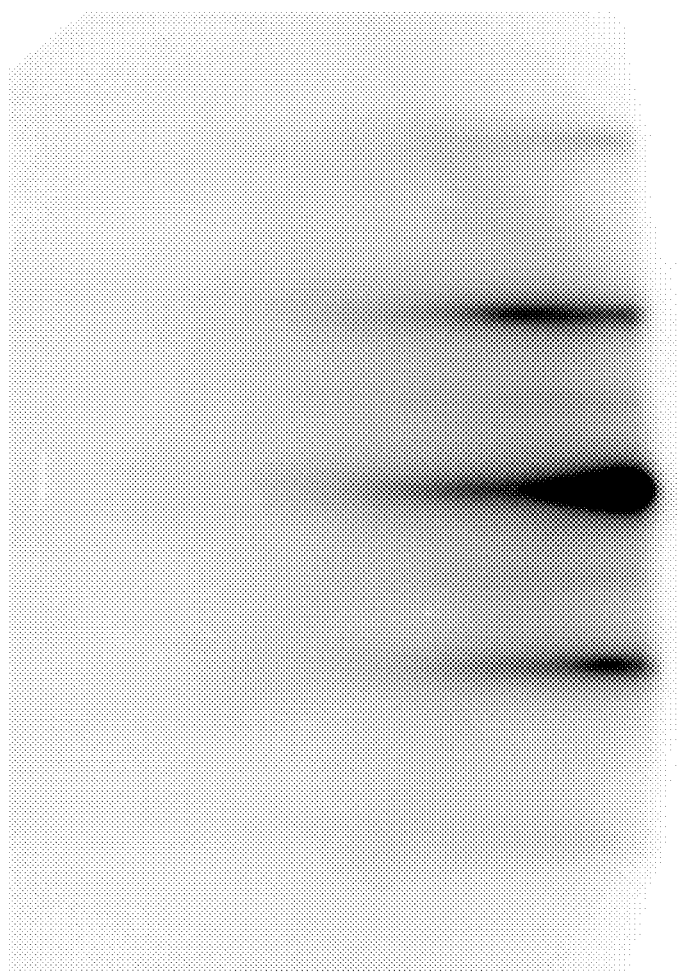
FIGS. 2A and 2B illustrate gallium nitride surfaces, in accordance with an exemplary embodiment of the disclosure.
Figure 2B:
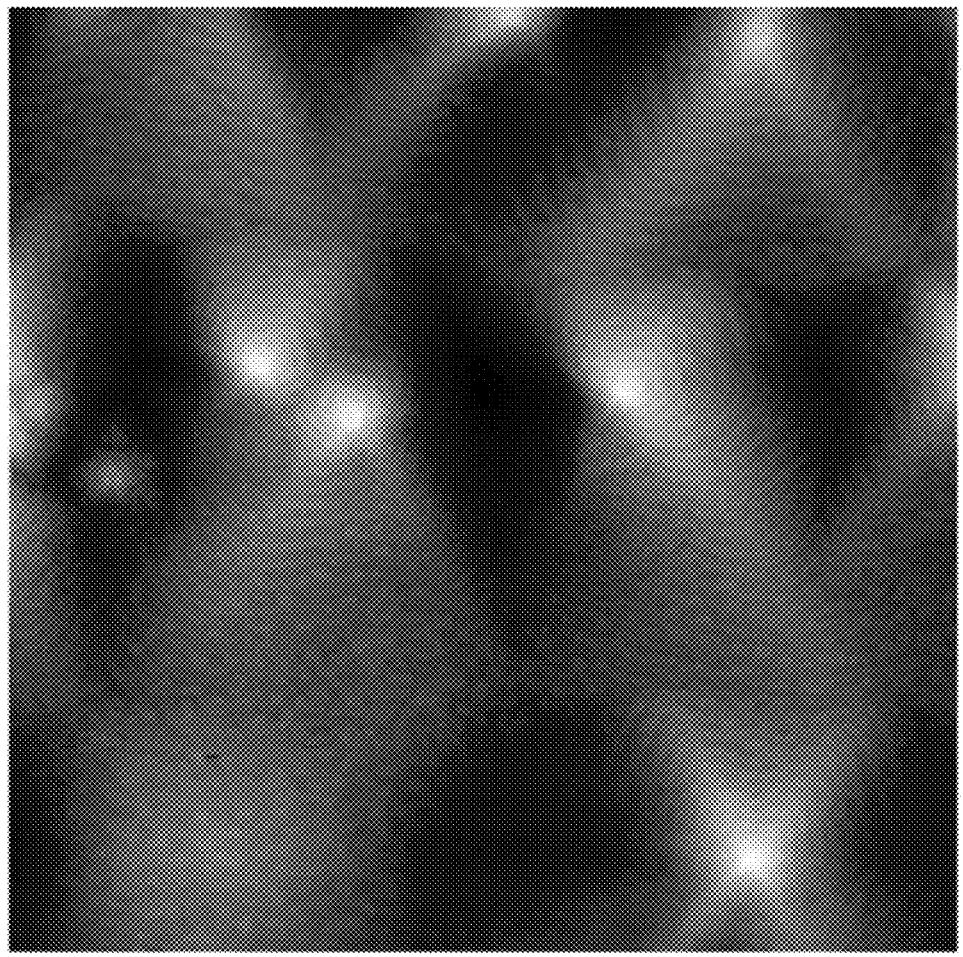

While the demonstration of high growth rates is beneficial for future applications, the films should also remain sufficiently high quality in order to be useful. FIGS. 2A and 2B display a representative RHEED image during growth (A), as well as a 2×2 µm AFM image for a film grown at 6.1 µm/hour at a substrate temperature of 600° C. (B). During the growth of these films under metal-rich conditions at 600° C. the RHEED patterns remained streaky and a 2×2 reconstruction was observed, indicating a smooth growth surface. The AFM image shows excellent dislocation-mediated step-flow morphology with clear atomic steps and spiral hillocks and a root mean square (RMS) roughness of just 0.8 nm. Such a surface structure is typical for high quality GaN grown by MBE, and is also seen at much lower growth rates. This observation confirms that the 2D growth mode is preserved even at growth rates more than an order of magnitude higher than are commonly used in GaN MBE.

Plasma Quality/Characterization

Figure 3A:
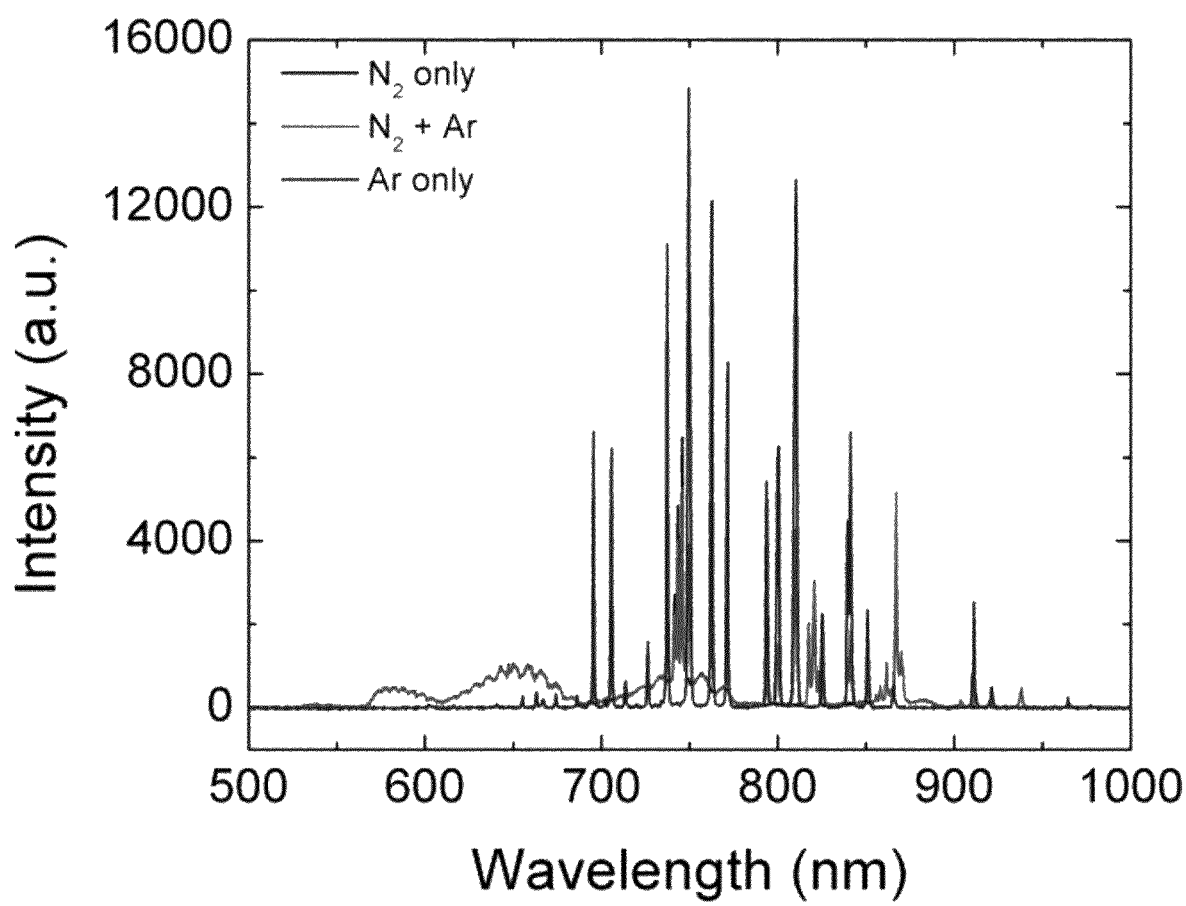
FIGS. 3A and 3B illustrate plasma emission spectra of the plasma gas, in accordance with an exemplary embodiment of the disclosure.
Figure 3B:
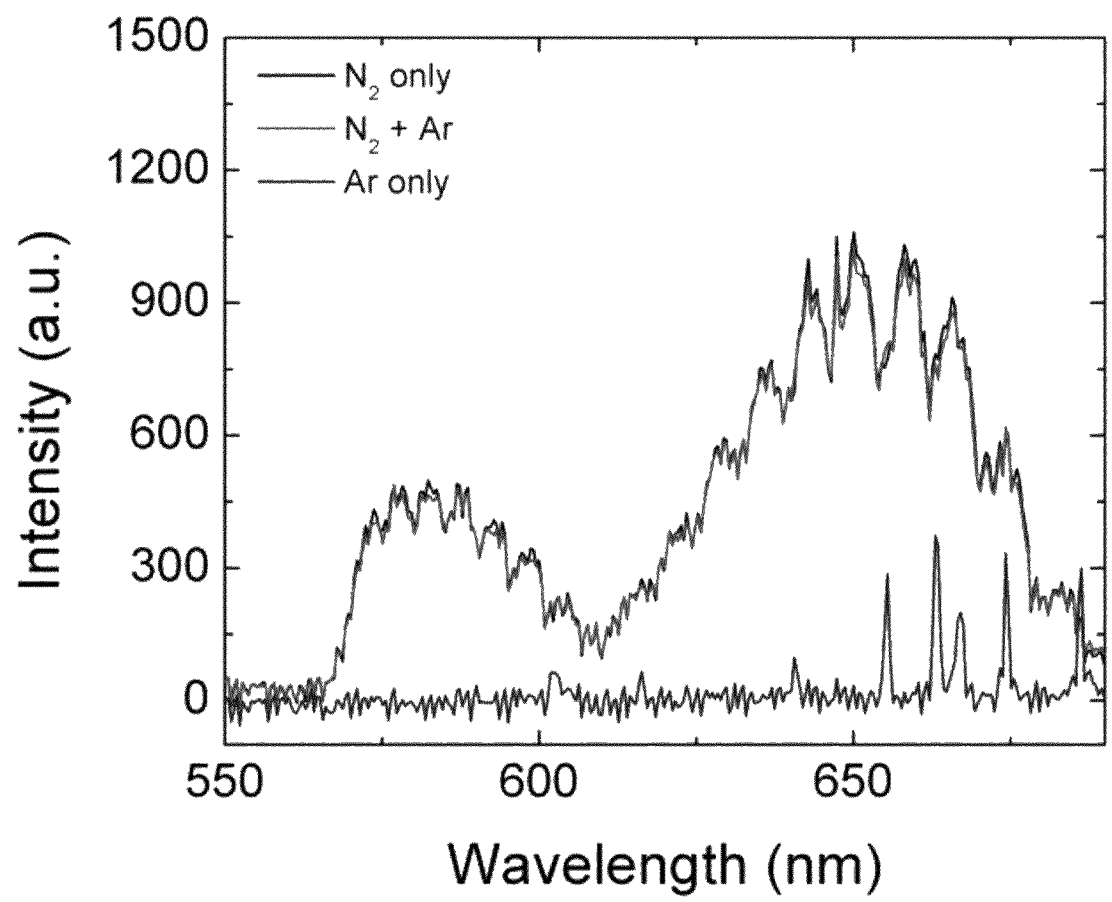

Plasma emission spectra were compared using a simple fiber-coupled spectrometer on the rear plasma window. The spectra in FIGS. 3A and 3B represent 20 SCCM pure $N_2$, a mixed plasma using 20 SCCM $N_2$ with 7.7 SCCM Ar, and finally a pure 7.7 SCCM Ar using 350 W of RF power in all cases. The full wavelength range is displayed (A) along with a zoom (B) of the region 550 nm to 690 nm corresponding to excited molecular nitrogen ($N_2^*$) which has been shown to directly affect growth rate of Group III-nitrides in plasma MBE.

From FIG. 3B it is clear that the addition of argon had no meaningful effect on the excited molecular nitrogen bands, in contrast to other findings using a mixed $N_2$/Ar plasma. However, the intensities of the argon-related emission lines were dramatically reduced by a factor of 3-4× in the mixed plasma compared to the pure argon plasma. Thus, it is possible that the reduction in argon-related emission intensity in the mixed plasma could be due to the transfer of kinetic energy from the argon species to the nitrogen species, enhancing the formation of other active nitrogen species besides molecular species and increasing the growth rate.

Figure 4:
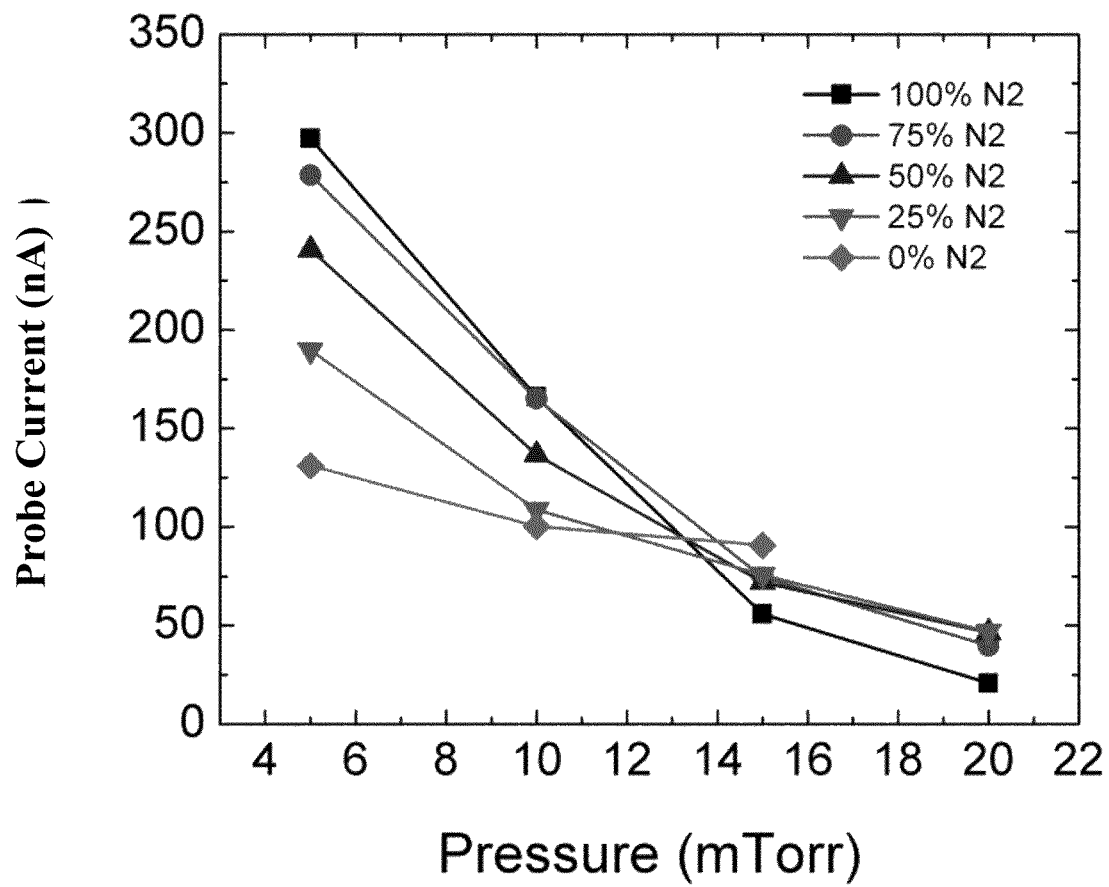
FIGS. 4 illustrates ion reductions based on probe current for varying amounts of pressure and gas combinations, in accordance with an exemplary embodiment of the disclosure.

To further explore the effects of argon in the plasma, the manipulator was put into the flux measurement position while measuring the collector current using a Keithley 6517B electrometer with the collector bias held at 0V. During the measurement, the grid voltage was set to 0V and the flux gauge filament was turned off with the collector shielded by earth ground except for a small opening facing the plasma source. This ensures that the only ionized/charged species reaching the collector were those coming from the plasma source itself and or species created near the collector of the ion gauge. As such, the collector functioned similar to a Langmuir probe where the collector current is related, albeit indirectly, to the ion content of the plasma as discussed below. FIG. 4 shows the resulting probe current from this experiment at 300 W RF power as a function of the nitrogen/argon plasma compositions as well as the approximate pressure inside the plasma bulb (i.e. behind the aperture plate) as calculated by the mass flow rate and the theoretical conductance of the aperture plate.

It should be first emphasized that this experimental configuration with zero bias will result in the collection of both electrons and ions, and is thus related to but not equal to the ion content. With a positive bias applied to the grid, positively charged primary ions should be rejected and negatively charged primary electrons attracted, or vice versa for a negative bias on the grid. However, in this experiment it was found that the probe current was always negative with a magnitude of at least 10 nA regardless of applied grid bias up to ±20V. This was not a measurement offset error as the probe current was less than 10 pA while the plasma was turned off. Thus, the only reasonable explanation for this persistent large negative current is the presence of a high density of secondary electrons created by the primary high energy species (ions and/or electrons from the plasma) which overwhelm the primary ion and electron currents from the plasma itself. Secondary electrons can be generated from nearby surfaces via impact ionization or photoemission, the latter having been acknowledged as a complicating factor but discounted herein as has been done in prior more detailed characterization efforts. Because the trends in optical intensity (described later) do not follow the trends in probe current, the role of photoemission is assumed negligible in the present case. However, both of these mechanisms (impact ionization and photoemission) suggest that the plasma produces sufficiently high energy primary species to cause ionization and, thus, potential ionizing damage to the sample during growth. Thus, we do not treat the measured collector currents as a direct measure of ion current but instead an impact ionization enhanced current related to but not equal to ion current. Therefore, regardless of sign of the current, variations in the current are assumed to originate from changes in the high energy, potentially damaging, primary plasma species.

From FIG. 4 it is clear that, in the lower pressure regime, the pure nitrogen plasma results in a dramatic increase of more than 100% in probe current compared to the pure argon plasma. Additionally, with proper dilution of the nitrogen with argon at lower pressure/flow, the probe current, and thus inferred ion/electron primary flux, can be dramatically reduced in order to minimize any detrimental effect of high energy species bombarding the sample surface and causing damage. Higher plasma pressure suppresses the ion content, making the ion content relatively unaffected by plasma composition. This observation of probe current shows two mechanisms to control plasma damage due to high energy species: in the lower flow regime by argon dilution and in the higher flow regime via pressure.

Figure 5A:
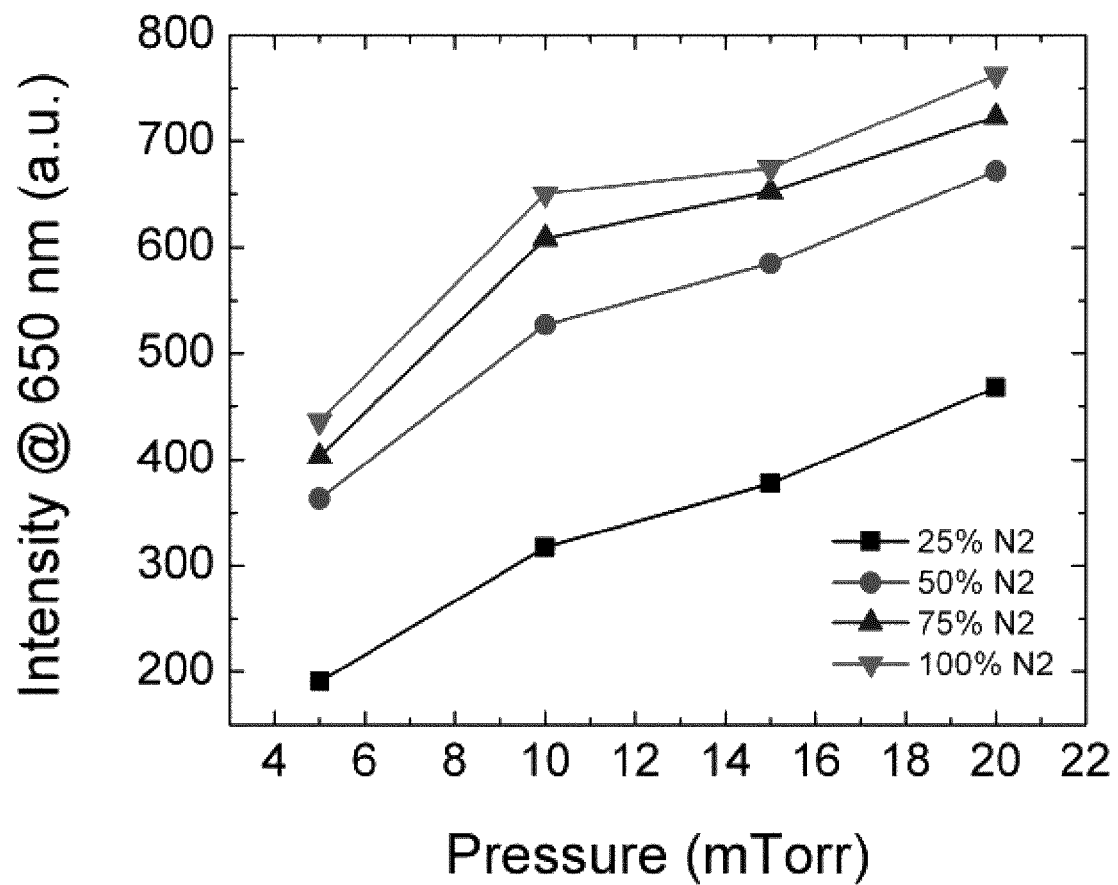
FIGS. 5A and 5B illustrate the molecular nitrogen and atomic nitrogen plasma emission intensities with changing pressure and gas combinations, in accordance with an exemplary embodiment of the disclosure.
Figure 5B:
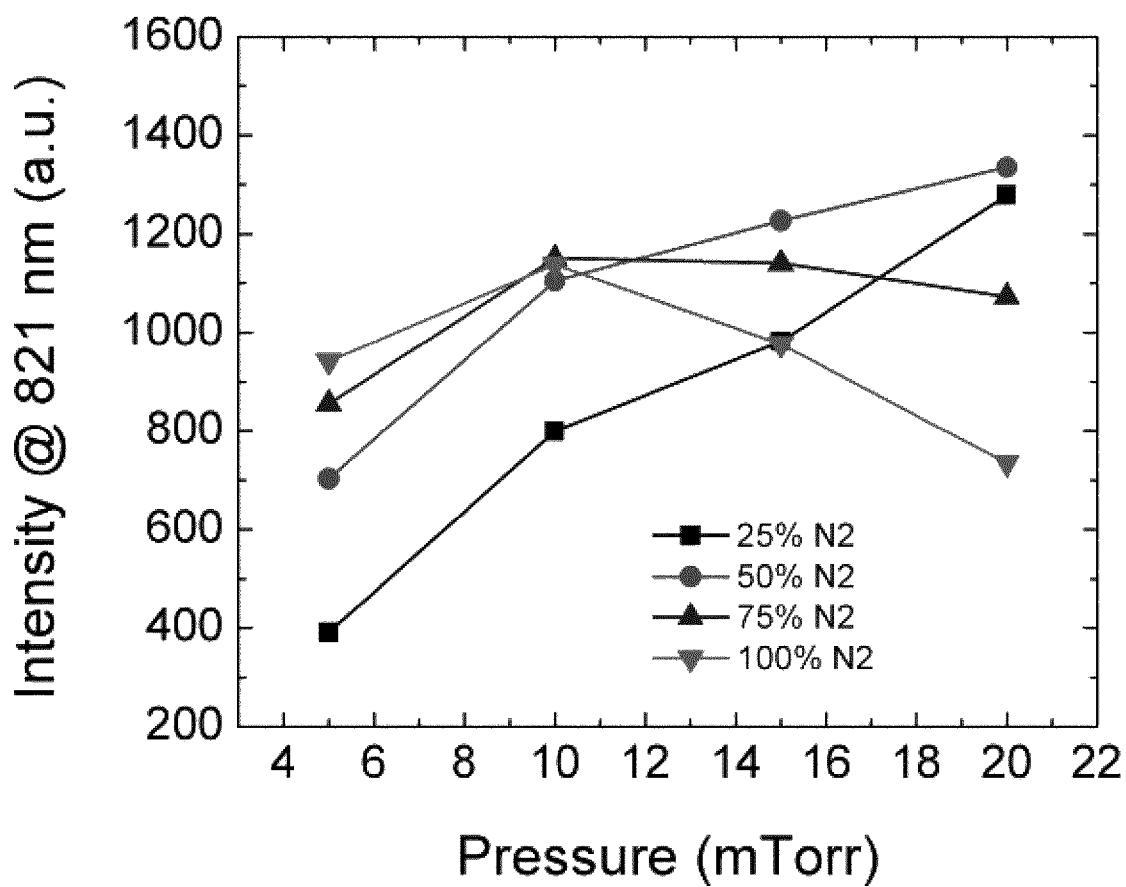

Shown in FIGS. 5A and 5B are the emission intensities at 300W RF power for the 650 nm and 821 nm plasma emission lines relating to molecular nitrogen (A) and atomic nitrogen (B) transitions. The 650 nm emission from excited molecular transitions in FIG. 5(a) shows a monotonic increase in intensity with increasing nitrogen composition in the plasma, and also with increasing pressure. Interestingly, a substantially different trend can be seen in the 821 nm atomic emission in FIG. 5(b) where the intensity trends do not follow the 650 nm molecular increases. At lower nitrogen compositions of 25% and 50%, the atomic nitrogen intensity increases with increasing pressure. However, above 50% nitrogen there is a peak in the atomic emission intensity at ~10 mTorr which then decreases at higher pressure. In the case of a pure nitrogen plasma, the atomic emission intensity is nearly 55% higher at 10 mTorr compared to 20 mTorr. The overall atomic nitrogen intensity is highest for a diluted plasma with just 50% nitrogen at 20 mTorr.

These trends in the atomic nitrogen intensity can further explain the increased growth rate with argon as described previously and as shown in FIG. 1(a). In the literature, there is no clear consensus which nitrogen species (atomic or molecular) is the primary contributor to growth during PAMBE of Group III-nitrides. In this work, at the higher plasma pressures where the growth rate is highest, there is a substantial shift in the trends of atomic nitrogen intensity compared to molecular nitrogen. In the high pressure/flow case, the dilution with ~25-50% argon minimally reduces the molecular emission but substantially increases the atomic emission intensity of the plasma. Thus, one would assume that the 20-25% increase in growth rate observed in FIG. 1(a) results from an enhancement in atomic nitrogen, not the traditionally assumed excited molecular species. At lower plasma chamber pressures, 10 mTorr or less, both the molecular and atomic nitrogen intensities are highest using a pure nitrogen plasma. But, at higher pressures like those used to achieve growth rates above 6 μm/hour, the atomic nitrogen is maximized for a mixed chemistry plasma with ~50% argon dilution. The maximum growth rate of 9.8 μm/hour reported here was achieved at a pressure of ~30 mTorr with a nitrogen composition of ~72%. A more in-depth study is currently underway in order to explore the relative effects of atomic and molecular nitrogen and the various plasma conditions on growth rate and structural/optical quality. But, from this preliminary characterization of the plasma, it is clear that both the atomic and molecular nitrogen species are important to consider, especially at the extremely high growth rates reported herein.

In this study, the maximum growth rate achieved was not limited by the plasma source, but rather by the 20 SCCM nitrogen mass flow controller which indicates that even higher growth rates should be possible. In addition, the growth rate can be reduced by varying the nitrogen and argon at low flow rates. With pure nitrogen, the plasma extinguished at a flow of ~3 SCCM due to insufficient back-pressure. However, it could be sustained by using a combination of 1 SCCM of nitrogen with 7.7 SCCM of argon, resulting in more traditional growth rates closer to 1 μm/hour. By lowering the argon content further, an additional reduction in growth rate might also be achievable to extend the range of possible growth rates. The varied growth rate from ~1 μm/hour up to 9.8 μm/hour represents nearly an order of magnitude achievable range of growth rates which can be tuned for rapid growth of thick buffer layers or precisely controlled quantum wells.

Doping with Ge vs Si

In order to achieve sufficient n-type doping at these elevated growth rates, some reconsideration of the Si doping method is needed. Typically, n-type doping in MOCVD growth using Si is limited to the low or mid 1019 $cm^{-3}$ range due to tensile stress and film cracking during cool down, as well as morphological degradation at higher Si concentrations. In MBE, due primarily to the lower substrate temperatures, this is less of an issue. Using MME, we have previously achieved extremely high Si doping with an electron concentration up to $2.5 \times 10^{20}$ $cm^{-3}$ and resistivity of $5 \times 10^{-4}$ Ω-cm for a 900 nm thick film with RMS roughness of just 0.3 nm. This film was grown at ~1 μm/hour, and the Si dopant cell required a temperature in excess of 1200° C. However, in order to achieve this high level of doping at elevated growth rates, an even higher cell temperature would be required, pushing the power limits of the cell and reducing effusion cell and/or crucible lifetime.

Figure 6:
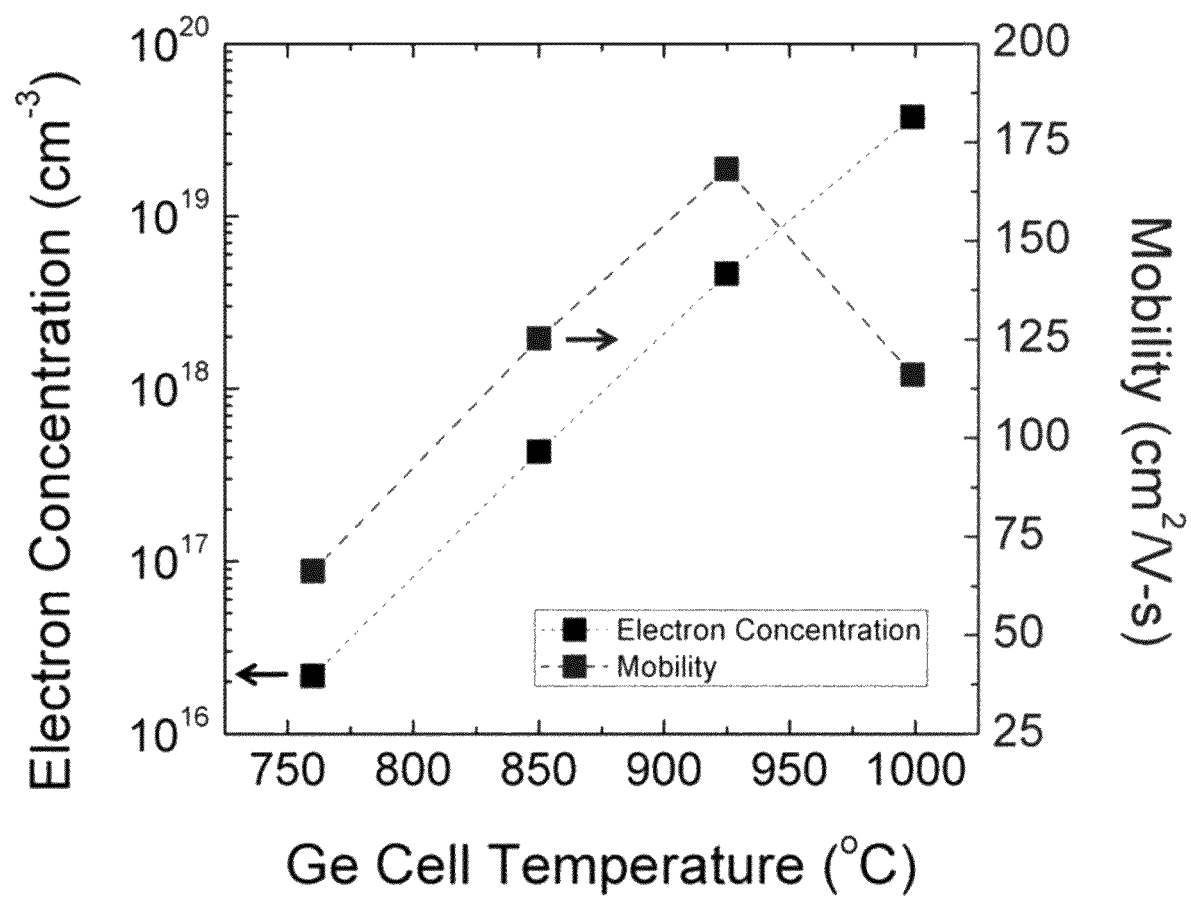
FIG. 6 illustrates electron concentration and mobility for germanium doping of a gallium nitride under various conditions, in accordance with an exemplary embodiment of the disclosure.

To circumvent this doping challenge at high growth rates, the use of Ge was explored as an alternative. Compared to Si, Ge has approximately two orders of magnitude higher vapor pressure for the same temperature. Or, to achieve the same vapor pressure as Si, a Ge cell could be run at approximately 200° C. lower temperature. Ge has been shown to have similar activation energy to Si in GaN, and induces substantially less stress on the crystal due to its closer atomic size match to the Ga atom it substitutes in the lattice. Given the lower temperature requirements with similar activation, Ge would seem an excellent alternative for high growth rate GaN. The use of Ge was investigated by varying the Ge cell temperature from 760° C. to 1000° C. with a fixed growth rate and Ga flux. FIG. 6 shows electron concentration (lower line) and mobility (upper line) as a function of Ge cell temperature. Sapphire substrates were used for this study to provide complete electrical isolation and minimize the effect of surface contamination. A ~500 nm thick AlN buffer layer was grown by MME after low-temperature nitridation. The resulting AlN, grown at nearly 2 μm/hour, showed (002) rocking curve (omega scan) full width at half maximum (FWHM) of around 80 arcsec with RMS roughness of ~0.5 nm. For the Ge-doped GaN grown at 650° C., MME was employed using a 10 s open/10 s closed shutter modulation with an III/V ratio of approximately 1.8, and both Ge and Ga were shuttered simultaneously. The plasma condition for these films was fixed at 350 22 W RF power with 4 SCCM $N_2$ flow, yielding a growth rate of approximately 2 μm/hour.

The electron concentration in FIG. 6 exhibits a highly predictable exponential dependence on the Ge cell temperature. The electron concentrations achieved varied from $2.2 \times 10^{16}$ cm$^{-3}$ at a Ge cell temperature of 760° C. up to $3.8 \times 10^{19}$ cm$^{-3}$ at a Ge cell temperature of 999° C. These low dopant cell temperatures leave substantial headroom for high n-type doping at high growth rates while simultaneously reducing wear on the cell and crucible. As a baseline, several unintentionally doped (UID) GaN films were grown by MME in order to characterize the background electron concentration. Since MBE grown films have background impurity concentrations inversely proportional to growth rate, low background impurity concentrations are expected at these high growth rates. Indeed, with the same conditions as discussed above, the UID GaN films exhibited repeatable background electron concentrations of $1\text{-}2 \times 10^{15}$ cm$^{-3}$ with resistivity on the order of 50-100 Ω-cm. The mobility, shown in blue in FIG. 6, initially rises with increasing Ge cell temperature then begins to fall once the electron concentration exceeds $4 \times 10^{18}$ cm$^{-3}$. This trend, along with the relatively low overall mobility, can be explained in the context of relatively high dislocation density resulting from the immature nature of these initial high growth rate studies.

In these non-optimized 1.8 μm thick GaN films grown on AlN buffer layers on sapphire, the XRD GaN (002) and (102) omega rocking curve FWHM are typically on the order of 250 arcsec and 1500 arcsec, respectively. Based on simple estimations from these two rocking curves, the threading dislocation density in these Ge-doped films is expected to be on the order of $5 \times 10^9$ to $1 \times 10^{10}$ cm$^{-2}$. With these relatively high dislocation densities, the mobility is strongly affected by dislocation scattering at low carrier concentrations. At higher carrier concentrations, the dislocation scattering is minimized due to charge screening, while at very high doping concentrations the mobility again decreases due to ionized impurity scattering. Thus, while the mobility in these Ge-doped samples is relatively low, it is well-described by physical models and limited by dislocation density. 41 It is expected that the mobility should be substantially higher when grown on lower dislocation density GaN templates or freestanding GaN.

It is to be understood that the embodiments and claims disclosed herein are not limited in their application to the details of construction and arrangement of the components set forth in the description and illustrated in the drawings. Rather, the description and the drawings provide examples of the embodiments envisioned. The embodiments and claims disclosed herein are further capable of other embodiments and of being practiced and carried out in various ways. Also, it is to be understood that the phraseology and terminology employed herein are for the purposes of description and should not be regarded as limiting the claims.

Accordingly, those skilled in the art will appreciate that the conception upon which the application and claims are based can be readily utilized as a basis for the design of other structures, methods, and systems for carrying out the several purposes of the embodiments and claims presented in this application. It is important, therefore, that the claims be regarded as including such equivalent constructions.

We claim:

1. A vacuum deposition method comprising:
   depositing semiconductor material on a substrate;
   flowing a plasma from a plasma chamber, though a gas-conductance barrier, and into a growth chamber;
   reducing the ion content of the plasma; and
   growing the thickness of the semiconductor material at a growth rate of greater than 3 μm/hour;
   wherein the semiconductor material is a group III metal nitride product; and
   wherein the group III metal nitride product is grown in the growth chamber.

2. The method of claim 1, wherein the growth rate is greater than 4 μm/hour.

3. The method of claim 1, wherein the growth rate is greater than 8 μm/hour.

4. The method of claim 1, wherein reducing the ion content of the plasma comprises providing the plasma with a pressure of at least about 1 mTorr.

5. The method of claim 1, wherein reducing the ion content of the plasma comprises seeding the plasma with an inert gas.

6. A vacuum deposition method for growing a semiconductor material comprising:
   flowing a plasma from a plasma chamber, though a gas-conductance barrier, and into a growth chamber; and
   growing a semiconductor material in the growth chamber;
   wherein the pressure of the plasma is at least about 1 mTorr.

7. The method of claim 6, wherein the growth rate of the semiconductor material is greater than 3 μm/hour.

8. The method of claim 6, wherein the growth rate of the semiconductor material is greater than 4 μm/hour.

9. The method of claim 6, wherein the growth rate of the semiconductor material is greater than 8 μm/hour.

10. A vacuum deposition system for growing a semiconductor material according to claim 1, the system comprising:
    a growth chamber having a substrate for growing the semiconductor material;
    a remote plasma chamber; and
    a gas-conductance barrier separating the plasma chamber from the growth chamber;
    wherein the system is configured such that a nitrogen gas flow of a plasma formed in the remote plasma chamber is scaled based on the equation $$SCCM = \frac{(GR) * (AREA)}{SCALE}$$

wherein:

GR is the growth rate of the semiconductor material in μm/hour;

AREA is the size of the substrate in inches^2; and

SCALE is a factor with units (μm inches^2)/(SCCM-hour) between 0.1 and 50.

11. A vacuum deposition method for growing a semiconductor material comprising:

flowing a plasma at a gas flow Q (Torr-liters/second) from a plasma chamber at a pressure $P_p$ (Torr), though a gas-conductance barrier with a conductance C (liters/second), and into a growth chamber at a pressure $P_g$ (Torr), wherein $P_g<P_p$; and determining Q through selection of $P_p$ and C such that Q is sufficient to grow a thickness of a semiconductor material in the growth chamber at a growth rate of greater than 3 μm/hour.

12. The method of claim 11, wherein $P_p>1$ mTorr; and wherein $P_g<1$ mTorr.

13. The method of claim 11, wherein $10^{-12}$ Torr$<P_g<10$ mTorr.

14. A vacuum deposition method for growing a semiconductor material comprising:

flowing a plasma at a gas flow Q (Torr-liters/second) from a plasma chamber at a pressure $P_p$ (Torr), though a gas-conductance barrier with a conductance C (liters/second), and into a growth chamber at a pressure $P_g$ (Torr);

configuring C such that $P_g<P_p$; and enforcing an ion reduction scheme on the plasma by selecting $P_p$ and a corresponding C such that Q is sufficient to grow a thickness of a semiconductor material in the growth chamber at a growth rate of greater than 3 μm/hour.

15. The method of claim 14, wherein the growth rate is greater than 4 μm/hour.

16. The method of claim 14, wherein the growth rate is greater than 8 μm/hour.

17. The method of claim 14, wherein the plasma is a non-noble gas plasma seeded with an inert gas selected from the group consisting of helium, neon, argon and xenon.

18. The method of claim 14, wherein the plasma is a nitrogen plasma seeded with an inert gas selected from the group consisting of helium, neon, argon and xenon; and wherein ratio of nitrogen to inert gas is at least 5:1.

19. The method of claim 14, wherein the plasma is a nitrogen plasma seeded with an inert gas selected from the group consisting of helium, neon, argon and xenon; and wherein ratio of nitrogen to inert gas is at least 10:1.

20. The method of claim 14, wherein the plasma is a nitrogen plasma seeded with an inert gas selected from the group consisting of helium, neon, argon and xenon; and wherein ratio of nitrogen to inert gas is between about 5:1 to about 20:1.

21. The method of claim 14, wherein C>0.1.

22. The method of claim 14, wherein C>3.

23. The method of claim 14, wherein C>15.

24. The method of claim 14, wherein C>100.

* * * * *